United States Patent [19]

Driver et al.

[11] Patent Number: 4,596,023
[45] Date of Patent: Jun. 17, 1986

[54] BALANCED BIPHASE TRANSMITTER USING REDUCED AMPLITUDE OF LONGER PULSES

[75] Inventors: R. Byron Driver; Larry Fullerton, both of Huntsville, Ala.

[73] Assignee: Complexx Systems, Inc., Huntsville, Ala.

[21] Appl. No.: 526,467

[22] Filed: Aug. 25, 1983

[51] Int. Cl.$^4$ .................. H03M 5/12; H04B 1/62; H04L 27/18

[52] U.S. Cl. .................. 375/55; 375/17; 375/60; 328/53; 332/18; 360/42

[58] Field of Search .................. 375/24, 42, 55, 60, 375/17; 307/264; 328/53; 332/17, 38, 42, 18; 360/42, 45

[56] References Cited

U.S. PATENT DOCUMENTS

| | | | |
|---|---|---|---|
| 3,287,647 | 11/1966 | Engel | 328/34 |
| 3,311,442 | 3/1967 | Jager et al. | 325/42 |
| 3,406,343 | 10/1968 | Mehlman | 375/42 |
| 3,461,237 | 8/1969 | Salter | 375/60 |
| 3,488,622 | 1/1970 | Vallee | 360/45 |
| 3,503,059 | 3/1970 | Ambrico | 360/45 |
| 3,521,274 | 7/1970 | Sawai | 375/19 |
| 3,705,398 | 12/1972 | Kostenbauer et al. | 375/55 |
| 3,747,024 | 7/1973 | Choquet et al. | 332/42 |
| 3,801,911 | 4/1974 | von Horsten | 178/66 R |
| 3,806,807 | 4/1974 | Nakamura | 375/42 |
| 3,846,583 | 11/1974 | Boulter | 375/55 |
| 3,919,476 | 11/1975 | Torpie | 178/68 |
| 3,962,647 | 6/1976 | Richman | 375/55 |
| 3,980,826 | 9/1976 | Widmer | 375/17 |
| 3,993,953 | 11/1976 | Lender et al. | 375/19 |
| 4,041,239 | 8/1977 | Haass | 178/68 |
| 4,064,361 | 12/1977 | Kustka et al. | 375/42 |
| 4,083,005 | 4/1978 | Looschen | 375/17 |
| 4,170,715 | 10/1979 | Mizokawa | 178/68 |
| 4,503,472 | 3/1985 | Lacher | 375/55 |

Primary Examiner—Benedict V. Safourek
Assistant Examiner—Raymond C. Glenny
Attorney, Agent, or Firm—Schwartz, Jeffery, Schwaab, Mack, Blumenthal & Evans

[57] ABSTRACT

The data communication system includes an encoder to receive nonreturn-to-zero data signals and convert them to biphase signals, a current mode transmitter for transmitting the biphase signals, and a communication link connected to the transmitter. The encoder senses transitions in the nonreturn-to-zero data signals and controls the amplitude of the biphase signals in response to the sensed transitions. These transitions are sensed by inverting and delaying the nonreturn-to-zero data signals and exclusively ORing these delayed and inverted signals with the nonreturn-to-zero data signals.

14 Claims, 5 Drawing Figures

BALANCED BIPHASE TRANSMITTER USING REDUCED AMPLITUDE OF LONGER PULSES

BACKGROUND OF THE INVENTION

The present invention relates to digital data communication systems and more particularly to such systems in which pulse coded data is transmitted over a two-wire or four-wire communication link.

It is known that communication links have band limited frequency response characteristics which affect the shape of transmitted pulses. The characteristics of the communication link can adversely affect various characteristics of the transmitted pulse and result in a DC bias being present on the transmission link. This DC bias is detrimental for many reasons and should be avoided.

In order to provide a balanced transmitted waveform, i.e., one which does not contain a variable DC component, it is known to use a biphase transmission code. This type of code contains pulses having a transition for each bit period so that the transmitted signal is balanced. However, even using such a balanced code, a net DC shift results in the communication link due to pulse distortion produced when the signal to be transmitted shifts from one symbol to another.

In addition, it has been found that the first pulse in any series of pulses transmitted across a band limited communication link results in a net DC shift which adversely affects the following pulses. This problem becomes more severe in local networks where the communication link is not used continuously. That is, where the standard operation consists of streams of pulses separated in time, the first pulse of each stream can produce a net DC bias which adversely affects detection of that stream.

Various communication systems have been proposed to reduce the effects of signal distortion caused by the transmission medium. For example, U.S. Pat. No. 4,041,239 to Haass discloses a method and apparatus to reduce the effects of signal distortions in data signals encoded into a combination of wide rectangular pulses and narrow rectangular pulses. A discriminator signal is produced upon the appearance of a wide rectangular pulse and a predistorted signal is produced by multiplying the encoded data signal with the discriminator signal.

U.S. Pat. No. 4,170,715 to Mizokawa discloses a communication system in which nonreturn-to-zero data signals are converted to pulse coded transmission data signals. The nonreturn-to-zero data signals are delayed by a prescribed time delay and an amplitude level changing circuit changes the amplitude level of the digital pulse coded transmission data signals in accordance with the pulse duration of the digital pulse coded transmission data signals on the basis of the delayed nonreturn-to-zero data signals.

Another problem which occurs in local networks is that several communication terminals can be connected or disconnected from a single two-wire communication link. Ideally, the communication link should be impendence matched to the terminals to provide a most efficient energy transfer. However, this requires that each time an additional terminal is connected to the same communication link, the impedences of each of the terminals be adjusted accordingly.

SUMMARY OF THE INVENTION

One object of the present invention is to provide a data communication system for transmitting digitally encoded data wherein the transmitted waveform is balanced; i.e. does not contain a variable DC component.

Another object of the present invention is to provide a data communication system where the transitted waveform contains a significant component of the bit rate to allow timing recovery from the received data waveform.

A further object of the present invention is to provide a data communication system in which the use of analog circuits is minimized.

Yet another object of the present invention is to provide a data communication system which provides superior transmission characteristics with a minimum number of components.

In accordance with the above and other objects, the present invention is a data communication system for transmitting digitally encoded data, comprising an encoder connected to receive nonreturn-to-zero data signals and converting the nonreturn-to-zero data signals to biphase signal pulses. A current mode transmitter receives the biphase signal pulses and transmits them across a two-wire communication link. A receiver is connected to the two-wire communication link for converting the biphase signal pulses into nonreturn-to-zero data signals. The encoder includes a circuit for sensing transitions in the nonreturn-to-zero data signals and emitting a control signal to the receiver for controlling the amplitude of transmitted pulses based on these transitions.

The encoder also includes a circuit for sensing the first pulse in a pulse stream and controlling the amplitude of the first pulse as it is transmitted to be less than the greatest amplitude of the remaining pulses in the pulse stream.

In accordance with other aspects of the present invention the transmitter comprises two current drivers which are separately controlled. One of the current drivers is controlled by the biphase signal pulses and the other current driver is controlled by the transition sensing circuit.

In accordance with further aspects of the invention, the transition sensing circuit comprises circuitry for inverting and delaying the nonreturn-to-zero data signals, and an exclusive OR gate for receiving the nonreturn to data signals and the inverted and delayed non-return to data signals. The exclusive OR gate outputs a signal which is used for controlling the amplitude of the pulses transmitted by the transmitter.

BRIEF DESCRIPTION OF THE DRAWINGS

The above and other objects of the present invention will become more readily apparent as the invention is more completely understood from the detailed description to follow, reference being had to the accompanying drawings in which like reference numerals represent like parts throughout, and in which.

DETAILED DESCRIPTION OF THE PREFERRED EMBODIMENTS

Figure 1:
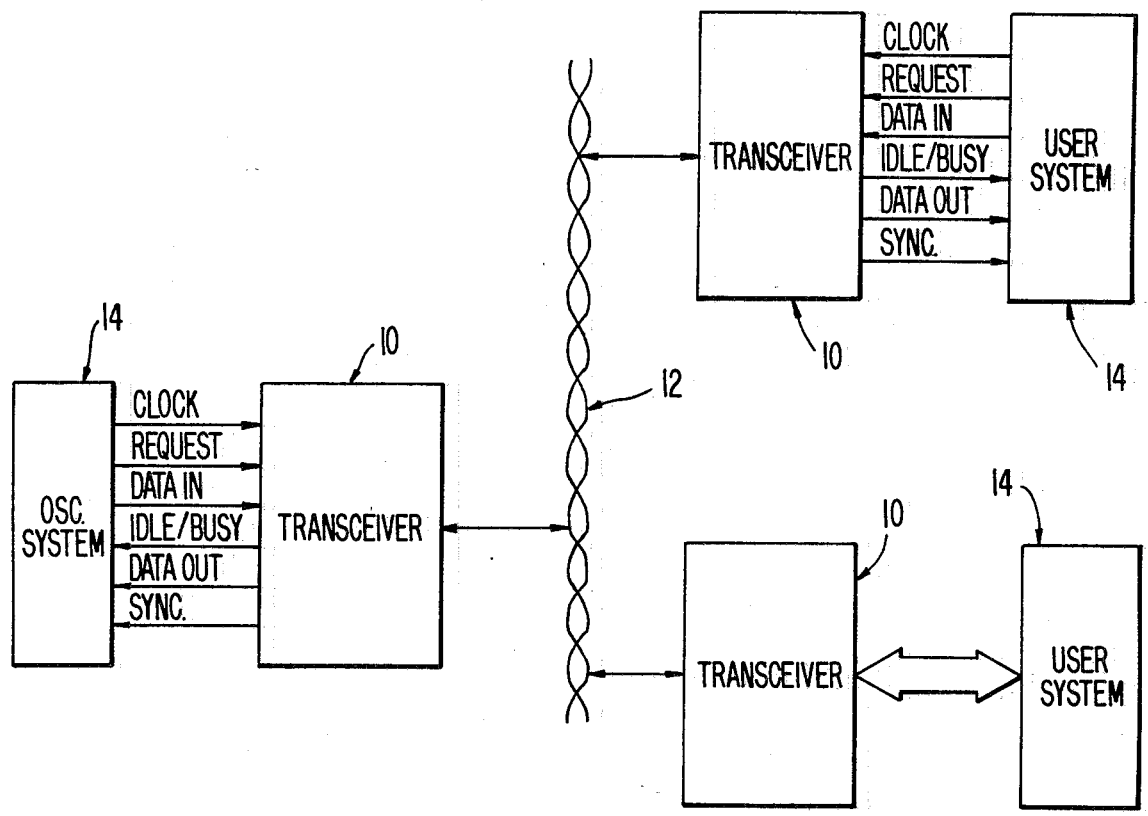
FIG. 1 represents a communication network incorporating the present invention.
Figure 2:
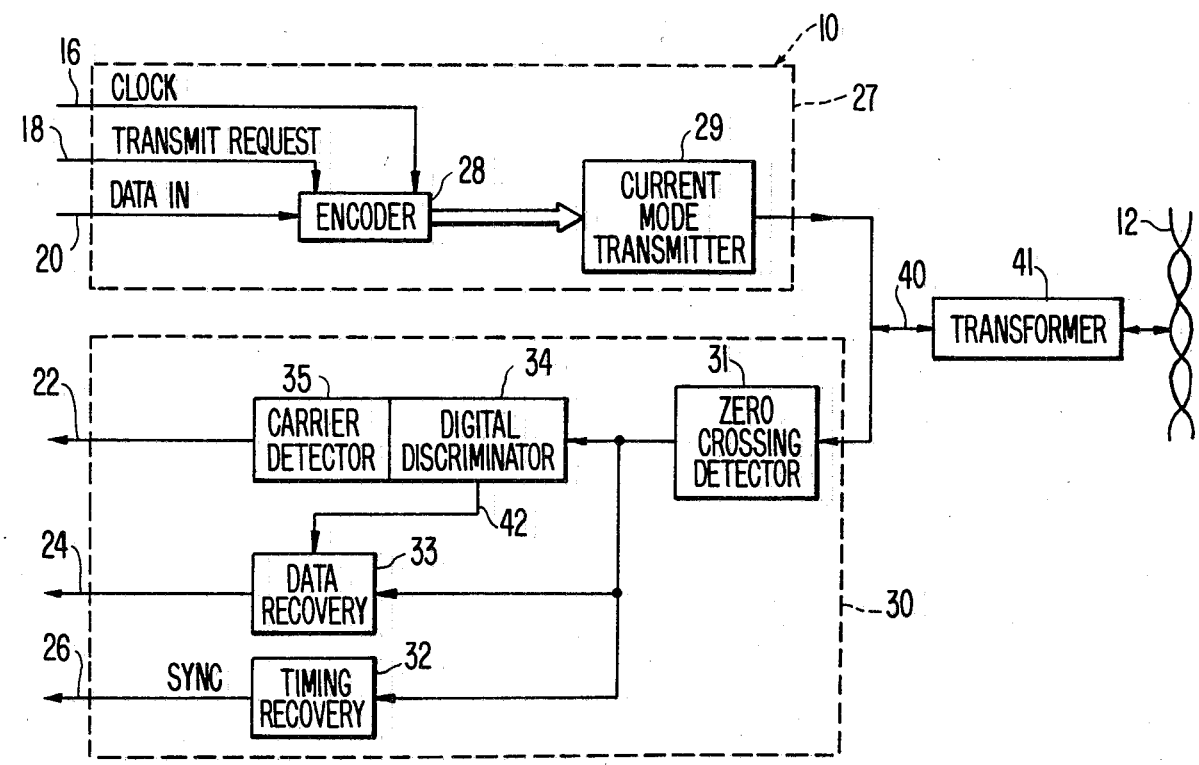
FIG. 2 is a block diagram showing a transceiver according to the present invention.

FIG. 1 shows a plurality of transceivers 10 which are connected to a two-wire communication link 12 on one hand and to a user system 14 on the other hand. User systems 14 can comprise, for example, a centralized host computer such as a microcomputer or a minicomputer, computer terminals, word processing stations, etc., which must communicate with one another. Periodically, when one user system 14 wishes to communicate with another user system 14, information is passed back and forth through transceiver 10 and two-wire communication link 12. As shown in FIGS. 1 and 2, each transceiver 10 receives a clock input on line 16 from the associated user system. Also, a transmit request line 18 passes a signal from the associated user system to indicate that information is about to be transmitted. Finally, a data input line 20 is connected to each transceiver 10 from the associated user system 14 to receive nonreturn-to-zero data to be transitted to another user system 14.

Each transceiver 10 passes a signal to the associated user system 14 on a line 22 to indicate whether the two-wire communication link 12 is idle or busy. Recovered data is passed to the associated user system on line 24, and a recovered timing signal is passed on line 26 to synchronize the receiving user system 14 with the transmitting user system 14.

Figure 3:
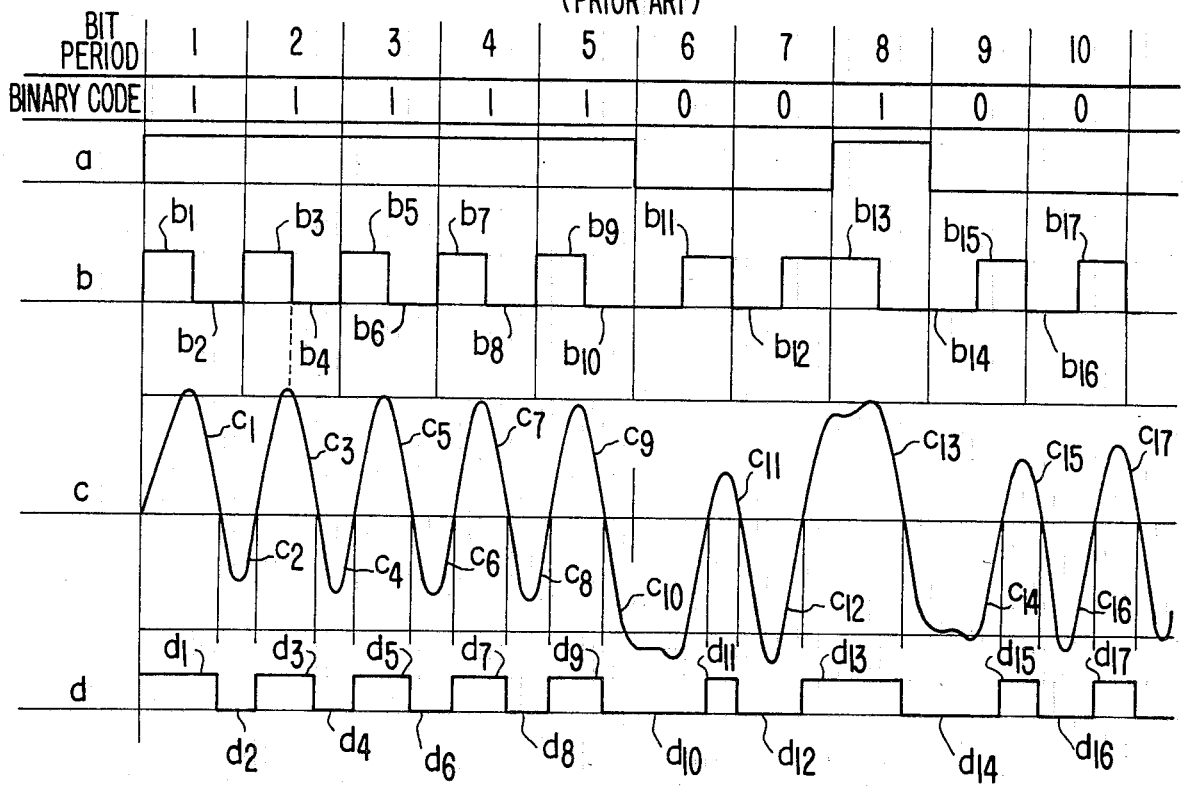
FIG. 3 is a timing chart depicting the manner in which DC shift is produced in a conventional communication system.

FIG. 3 shows a timing diagram for a typical prior art communication system. Waveform a represents a nonreturn-to-zero data signal to be transmitted. In order to balance each transmitted bit, binary signal a is converted to a biphase or Manchester code shown as signal b. Biphase signal b includes a transition for each bit period. A rising midcell pulse represents a logical 0 and a falling midcell pulse represents a 1. The midcell transitions allow a single wire pair to carry both timing and data signals.

Signal c shows a transmitted biphase signal, and signal d shows the recovered biphase pulses which are obtained from transmitted signal c by detecting zero crossings of signal c. It should be noted that signal c is a bipolar signal so that a 1 level of signal b corresponds to a positive peak of signal c and a zero level of signal b corresponds to a negative peak of signal c. Also, it will be noted that signal b consists of wide pulses and narrow pulses, the narrow pulses having a width one-half that of the wide pulses. The wide pulses occur whenever there is a transition in the state of nonreturn-to-zero signal a.

There are two problems which occur in transmitting signal c. First, it will be noted that the first pulse $c_1$ of signal c corresponds to a narrow pulse $b_1$ of signal b. However, the recovered first pulse $d_1$ of signal d is wider than desired. This apparently due to the fact that pulse $c_1$ adds a positive DC bias to signal c. This DC bias affects the following pulses $c_2$ through $c_9$ such that the positive pulses $c_3$, $c_5$, $c_7$ and $c_9$ result in recovered pulses $d_3$, $d_5$, $d_7$ and $d_9$ which are wider than desired and negative pulses $c_2$, $c_4$, $c_6$ and $c_8$ result in zero level pulses $d_2$, $d_4$, $d_6$ and $d_8$ which are narrower than desired. The double wide negative pulse $c_{10}$ then adds a negative DC bias to signal c such that positive pulse $c_{11}$ is smaller than desired and correspondingly, recovered pulse $d_{11}$ is narrower than desired. The next negative pulse $c_{12}$ is then wider than desired. Pulse $c_{12}$ is followed by a positive pulse $c_{13}$ which is followed by a negative pulse $c_{14}$. As can be appreciated, the double wide pulses $c_{13}$ and $c_{14}$ are not as affected by the frequency limitations of the transmission link as the narrower pulses. They do, however, affect any following narrower pulses in that they add a DC bias to the following narrower pulses as shown by pulses $c_{15}$, $c_{16}$ and $c_{17}$.

Returning again to FIG. 2, it will be seen that transceiver 10 includes a modulator 27 having an encoder 28 and a current mode transmitter 29, and a demodulator 30 having a zero crossing detector 31 feeding a timing recovery circuit 32, a data recovery circuit 33, and a digital discriminator 34 and carrier detector 35.

Encoder 28 receives the clock signal on line 16, transmit request signal on line 18, and the data on line 20, and outputs biphase signals and amplitude control signals to current mode transmitter 29. Encoder 28 rectifies the problems discussed above with respect to signal c in FIG. 3 by transmitting the first pulse at an amplitude which is one-half of that of any succeeding narrower pulses and by transmitting any wider pulses resulting from a transition in the binary code level at half the amplitude of the narrow pulses also, as will be discussed hereinafter.

Current mode transmitter 29 passes signals through line 40 to a transformer 41 which is connected to two-wire communication link 12. A current mode transmitter is used here to minimize the possibilities of reflections on the communication link 12 and to eliminate the need to physically switch the cable driver during transmit/receive. Accordingly, the zero crossing detector 31 is connected to the same line 40 as current mode transmitter 29. Zero crossing detector 31 receives the signals from line 40 and outputs squarewaves which are equivalent to the original transmitted biphase code. This recovered biphase code is then supplied to digital discriminator 34 and to data recovery circuit 33. Discriminator 34 is essentially a pulse width detector which produces an output pulse on line 42 at three-quarters of a bit time referenced from the midpoint of the previous bit time so that a pulse is produced at one-quarter of the next succeeding bit time. This pulse is used as a clock input for a flip-flop in data recovery circuit 38 and the biphase signal from zero crossing detector 31 is used as the data input for the same flip-flop. Accordingly, the flip-flop is clocked during the first half of each bit time which represents the nonreturn-to-zero data. In this manner, the original data signal is supplied on line 24. Carrier detector 35 receives the output from discriminator 34 and produces a constant level signal on line 22 indicating that the communication link 12 is busy when an output is received from discriminator 34. Timing recovery circuit 32 restores the clock signal based on transitions of the biphase signal. A conventional clock recovery circuit is used for this purpose. All of the circuits of demodulator 30 are conventional and will therefor not be discussed in detail inasmuch as their construction would be well-known to one of ordinary skill in the art.

Figure 4:
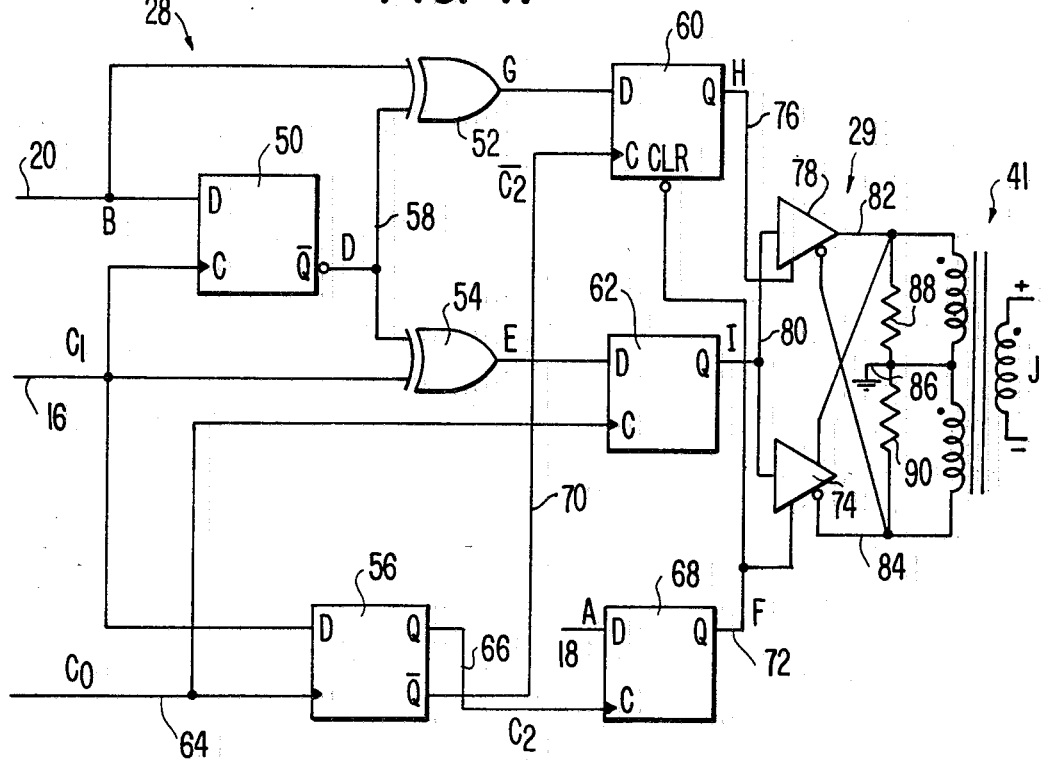
FIG. 4 is a circuit diagram showing an encoder and transmitter according to the present invention.
Figure 5:
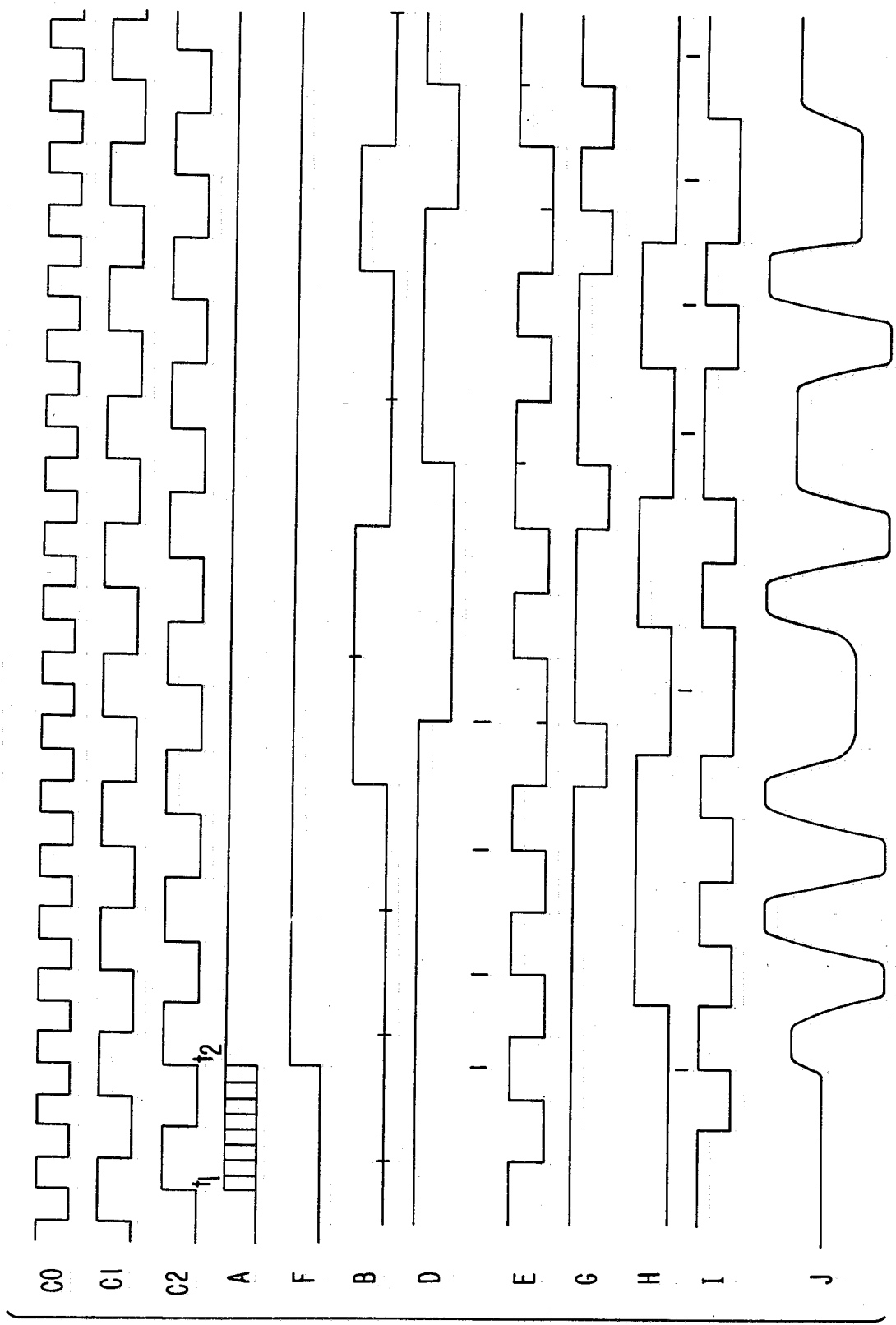
FIG. 5 is a timing diagram for the encoder and transmitter of FIG. 4.

FIG. 4 shows the encoder 28, current mode transmitter 29 and transformer 41 in greater detail. FIG. 5 shows a timing diagram which clearly sets forth the operation of the circuit of FIG. 4.

Signal B represents the nonreturn-to-zero (NRZ) data supplied to encoder 28 on line 20. This data is supplied to the data input of a flip-flop 50 and to an exclusive OR gate 52. Clock signal $C_1$ is supplied on line 16 to the clock input of flip-flop 50, to one input of exclusive OR gate 54 and to the data input of a flip-flop 56. Signal D is taken from the inverted output of flip-flop 50 and supplied on line 58 to exclusive OR gates 52 and 54. The output of exclusive OR gate 52 is shown as signal G and is supplied to the data input of a flip-flop 60. The output of exclusive OR gate 54 is shown as signal E and is supplied to the data input of a flip-flop 62. A second timing signal $C_0$ has a frequency twice that of clock signal $C_1$. Signal $C_0$ is generated internally by any means as would be apparent to one of ordinary skill in the art and is supplied on line 64 to the clock input flip-flop 56 and to the clock input of flip-flop 62. The noninverted output of flip-flop 56 is a third clock signal $C_2$ which is supplied on line 66 to the clock input of a flip-flop 68, and the inverted output of flip-flop 56 is supplied on line 70 to the clock input of flip-flop 60. The data input of flip-flop 68 is connected to line 18 and receives transmit request signal A. The non-inverting output of flip-flop 68 produces signal F which is connected through line 72 to the clear input of flip-flop 60 and to enable input of a current driver 74. The non-inverting output or flip-flop 60 is signal H which is supplied on line 76 to enable the input of a second current driver 78. The output of flip-flop 62 is signal I which is supplied on line 80 to the input of current drivers 74 and 78. Each current driver has an inverting output and a non-inverting output which are connected in parallel across the terminals 82 and 84 of the primary of center tap transformer 41. The secondary of transformer 41 is connected to communication link 12. The center tap of transformer 41 is connected to ground through line 86. Resistor 88 is connected between line 82 and line 86 and resistor 90 is connected between line 84 and line 86. Resistors 88 and 90 are provided to adjust the impedance of the transceiver as viewed from communication link 12.

In operation, timing signal $C_1$, the request to transmit signal A and data signal B are received by the encoder 28. Encoder 28 generates timing signal $C_0$ in any well-known manner and produces timing signals $C_2$ and $\overline{C}_2$ by clocking signal $C_1$ with $C_0$ in flip-flop 56.

Request to transmit signal A can be received anytime between $t_1$ and $t_2$ shown in FIG. 5. This signal is synchronized with timing signal $C_2$ in flip-flop 68 which delays signal A by a period not greater than one bit time of signal $C_2$ to produce signal F. Signal F disables current driver 74 until the second clock pulse of signal $C_2$ and clears flip-flop 60 until this time also.

Flip-flop 50 is triggered by the rising edge of clock signal $C_1$ pulses. The falling edge of the pulses of signal $C_1$ are synchronized with the beginning of the bit times for NRZ data signal B. Accordingly, flip-flop 50 serves to delay signal B by one-half of a bit time and invert signal B. The inverted signal B is exclusively ORed in gate 52 so as to produce signal g which is high except for a low level pulse which is emitted each time that NRZ signal B experiences a transition in state from one to zero or zero to one. This signal indicating transitions in state of NRZ signal B is widened to a full bit period in flip-flop 60 and synchronized with the trailing and leading one-half bit periods giving rise to the associated transition in signal B so as to control the amplitude of the pulse emitted from current mode driver in response to the associates transitional signals.

Exclusive OR gate 54 generates signal E which is the biphase signal corresponding to NRZ data signal B. Flip-flop 62 delays signal E by one-quarter bit time to produce biphase signal I which is synchronized with signal F.

Signal F enables current driver 74 just prior to the first bit time and removes the clear signal from flip-flop 60 simultaneously. The signal H output from flip-flop 60 remains low for an additional half bit time until the next rising pulse of the signal $\overline{C}_2$. Accordingly, current driver 78 remains disabled at least for the first one-half bit time after which signal G controls flip-flop 60 and controls current driver 78 so that the current driver is enabled and disabled in response to transitions of NRZ signal B.

As can be seen from FIG. 5, current driver 78 is disabled during the first half bit time of any pulse stream and is also disabled during the half bit time preceeding a change in state of the corresponding bit of NRZ signal B and during the next succeeding half bit time. Current driver 74 is enabled and driven strictly by biphase signal I. Accordingly, each half bit time of the biphase signal transmitted has a current output at least equivalent to the output of current driver 74 while each half bit time which either is not the first half bit time of the current stream or does not precede or succeed a change in state of NRZ signal B also has a current level increased by the output of current driver 78.

While the outputs of current drivers 74 and 78 can be adjusted to any desired relationship, it has been found that producing an equal output current is satisfactory. Thus, the transmitted bit times are either at current level times 1 or current level times 2.

As discussed above, current mode drivers are used in the present invention due to their inherent high impedence characteristics which minimizes the possibility of reflections on the data link 12 and therefor eliminates the requirement to physically switch the system during transmit and receive. The center tap transformer 41 is used to insure a true differential signal on the communication link. In addition, the impedance of the transformer and therefore the impedance looking back into the transceiver ($Z_j$) from communication link 12 is maintained at a high value by resistors 88 and 90 which have an equal resistance represented by R. This impedence is calculated by the following:

$$Z_J = R/2n^2$$

where n equals the turns ratio between the primary coils of center tap transformer 41 and the secondary of the transformer where both primary coils have the same number of turns.

In order to obtain true impedance matching, $Z_J$ should equal the load resistance $R_L$ on data link 12. In this case, R should equal $2R_L$.

However, in order to prevent loading of multiple units in a bus configuration, $Z_J$ must be much greater than $R_L$ which means that R must be much greater than $2R_L$. Accordingly, by increasing the resistance R to a relatively high value, units can be added or deleted from communication link 12 without deleteriously affecting the operation of the overall system.

The foregoing description has been set forth for purposes of illustrating the present invention but is not deemed to limit the scope thereof. Clearly, numerous modifications could be made to the invention withouth departing from the scope thereof as set forth in the appended claims.

What is claimed is:

1. A data communication system for transmitting digitally encoded data, comprising:
an encoder connected to receive nonreturn-to-zero data signals and converting said nonreturn-to-zero signals to biphase signal pulses;
a current mode transmitter for transmitting said biphase signal pulses;
a communication link connected to said transmitter; and
a receiver connected to said communication link for receiving biphase signal pulses and converting said biphase signal pulses into nonreturn-to-zero data signals; wherein
said encoder comprises means for sensing transitions in said nonreturn-to-zero data signals, and means for controlling the amplitude of pulses transmitted by said current mode transmitter based on said sensed transitions, said transition sensing means comprising means for inverting and delaying said nonreturn-to-zero data signals, and an exclusive OR gate for receiving said nonreturn-to-zero data signals and said inverted and delayed nonreturn-to-zero data signals, said exclusive OR gate outputting a signal for controlling said amplitude of pulses transmitted by said current mode transmitter.

2. A data communication system according to claim 1 wherein said encoder further comprises means for sensing the first pulse in a pulse stream and controlling the amplitude of said first pulse to be less than the greatest amplitude of the remaining pulses in said pulse stream.

3. A data communication system as set forth in claim 2 wherein said first pulse sensing means comprises means for receiving a request to transmit signal and delaying said request to transmit signal by a time not greater than one bit period of said nonreturn-to-zero data.

4. A data communication system as set forth in claim 1 wherein said encoder further comprises a second exclusive OR gate for receiving said inverted and delayed nonreturn-to-zero data signals and a timing signal having a period equal to one-half the bit period of said nonreturn-to-zero data signals for producing said biphase signal pulses.

5. A data communication system as set forth in claim 1 wherein said current mode transmitter comprises two current drivers, one of said current drivers being controlled by said biphase signal pulses and the other of said current drivers being controlled by said transition sensing means.

6. A data communication system as set forth in claim 1 including means for producing a high impedance as viewed from said communication link.

7. A data communication system comprising:
an encoder comprising means for receiving nonreturn-to-zero data signals and converting said nonreturn-to-zero data signals to biphase signal pulses, and means for sensing transitions in said nonreturn-to-zero data signals and outputting an amplitude control signal in response thereto for controlling the amplitude of said biphase signal pulses such that pulses corresponding to a half bit period preceding a change in state of said nonreturn-to-zero data signal and a half bit period following said change in state having a different amplitude than other transmitted pulses, said transition sensing means comprising means for inverting and delaying said nonreturn-to-zero data signals, and an exclusive OR gate for receiving said nonreturn-to-zero data signal and said inverted and delayed nonreturn-to-zero data signal, said exclusive OR gate outputting a signal for controlling said amplitude of pulses transmitted by said current mode transmitter;
transmitter means for receiving said amplitude control signal and said biphase pulse signals and transmitting variable amplitude biphase pulses across a communication link in response thereto.

8. A data communication system as set forth in claim 7 wherein said other pulses have an amplitude approximately twice said corresponding pulses.

9. A data communication system as set forth in claim 7 further including means for sensing the first pulse in a data stream and producing a signal in response thereto for causing said transmitter to transmit said first pulse in said data stream at a relatively low amplitude.

10. A data communication system as set forth in claim 9 wherein said first pulse sensing means comprises means for receiving a transmit request signal and a timing signal having a period equal to one bit length of said nonreturn-to-zero data signal, and delaying said transmit request signal by a period not greater than one bit length of said timing signal.

11. A data communication system as set forth in claim 9 wherein said current mode transmitter comprises two current drivers, one of said current drivers being controlled by said biphase signal pulses, and the other of said current drivers being controlled by said amplitude control signal from said transition sensing means.

12. A data communication system as set forth in claim 7 wherein said transmitter means is a current mode transmitter.

13. A method of transitting data across a communication link, comprising:
receiving nonreturn-to-zero data signals and converting said nonreturn-to-zero data signals to biphase signal pulses;
sensing transitions in said nonreturn-to-zero data signals by inverting and delaying said nonreturn-to-zero data signals, exclusively ORing said nonreturn-to-zero data signals and said inverted and delayed nonreturn-to-zero data signals to provide a signal indicating said transitions; and
controlling the amplitude of said biphase signals in response to said signal indicating said transitions by producing biphase signal pulses at a low amplitude corresponding to a half bit period preceding a transition of said nonreturn-to-zero data and a half bit period following said transition and producing other biphase signal pulses at a high amplitude.

14. The method according to claim 13 including transmitting a first pulse in a data stream at a low amplitude and transmitting other pulses in said data stream at a higher amplitude.

* * * * *